United States Patent
Shin et al.

(10) Patent No.: US 8,368,055 B2
(45) Date of Patent: Feb. 5, 2013

(54) DISPLAY DEVICE INCLUDING ORGANIC LIGHT-EMITTING TRANSISTOR AND A FLUORECENT PATTERN AND METHOD OF FABRICATING THE DISPLAY DEVICE

(75) Inventors: Jung-Han Shin, Yongin-si (KR); Jae-Byung Park, Seongnam-si (KR); Don-Chan Cho, Seongnam-si (KR); Jin-Seob Byun, Seoul (KR); Hyoung-Joo Kim, Uiwang-si (KR)

(73) Assignee: Samsung Display Co., Ltd. (KR)

( * ) Notice: Subject to any disclaimer, the term of this patent is extended or adjusted under 35 U.S.C. 154(b) by 106 days.

(21) Appl. No.: 12/543,383

(22) Filed: Aug. 18, 2009

(65) Prior Publication Data

US 2010/0155705 A1 Jun. 24, 2010

(30) Foreign Application Priority Data

Dec. 24, 2008 (KR) .................. 10-2008-0133719

(51) Int. Cl.
*H01L 29/08* (2006.01)
*H01L 35/24* (2006.01)
*H01L 51/00* (2006.01)
*H01L 29/201* (2006.01)
*H01L 33/00* (2010.01)
*H01L 21/00* (2006.01)

(52) U.S. Cl. ................ 257/40; 257/90; 438/28; 438/29; 438/35; 438/39; 438/47

(58) Field of Classification Search ............... 257/40, 257/79–103; 438/22–47
See application file for complete search history.

(56) References Cited

U.S. PATENT DOCUMENTS

| 6,091,195 A * | 7/2000 | Forrest et al. ................. 313/504 |
| 6,384,529 B2 * | 5/2002 | Tang et al. ................... 313/506 |
| 6,525,467 B1 * | 2/2003 | Eida et al. .................... 313/506 |
| 7,923,918 B2 * | 4/2011 | Tamaki et al. ............... 313/503 |
| 2002/0113546 A1 * | 8/2002 | Seo et al. ...................... 313/504 |
| 2003/0052600 A1 * | 3/2003 | Sundahl et al. .............. 313/512 |
| 2005/0099808 A1 * | 5/2005 | Cheng et al. ................. 362/231 |
| 2005/0224830 A1 * | 10/2005 | Blonder et al. .............. 257/100 |
| 2006/0171152 A1 * | 8/2006 | Suehiro et al. ............... 362/363 |

(Continued)

FOREIGN PATENT DOCUMENTS

JP 2005129509 A * 5/2005
JP 2007-027578 2/2007

(Continued)

OTHER PUBLICATIONS

English Abstract for Pat. Pub. No. KR 1020070115167.

(Continued)

*Primary Examiner* — Fernando L Toledo
*Assistant Examiner* — Karen Kusumakar
(74) *Attorney, Agent, or Firm* — Innovation Counsel LLP

(57) ABSTRACT

Provided are a display device, which has a longer life and can be fabricated simply relative to conventional display devices, and a method of fabricating the display device. The display device includes a substrate which includes first through third subpixel regions, first through third organic light-emitting transistors which are disposed in the first through third subpixel regions, respectively, and are operable to emit light of a first color, and a first fluorescent pattern which is formed on the first organic light-emitting transistor and is operable to cause light of a second color to be emitted.

19 Claims, 11 Drawing Sheets

U.S. PATENT DOCUMENTS

| | | | |
|---|---|---|---|
| 2006/0197460 A1* | 9/2006 | Lin et al. | 315/169.3 |
| 2006/0214578 A1* | 9/2006 | Iwanaga et al. | 313/512 |
| 2007/0075310 A1* | 4/2007 | Lee | 257/40 |
| 2007/0205423 A1* | 9/2007 | Yamazaki et al. | 257/89 |
| 2007/0247067 A1* | 10/2007 | Segal et al. | 313/506 |
| 2008/0030833 A1* | 2/2008 | Park | 359/259 |
| 2008/0073653 A1* | 3/2008 | Iwasaki | 257/79 |
| 2008/0121911 A1* | 5/2008 | Andrews et al. | 257/98 |
| 2008/0174239 A1* | 7/2008 | Yoo et al. | 313/504 |
| 2008/0258146 A1* | 10/2008 | Lin | 257/57 |
| 2009/0130941 A1* | 5/2009 | Boroson et al. | 445/25 |
| 2009/0179208 A1* | 7/2009 | Obata et al. | 257/88 |
| 2009/0230383 A1* | 9/2009 | Meng et al. | 257/40 |
| 2009/0251047 A1* | 10/2009 | Lee et al. | 313/504 |
| 2009/0256145 A1* | 10/2009 | Saito et al. | 257/40 |
| 2010/0025670 A1* | 2/2010 | Saito et al. | 257/40 |
| 2010/0065864 A1* | 3/2010 | Kessels et al. | 257/89 |
| 2010/0090203 A1* | 4/2010 | Obata et al. | 257/40 |
| 2010/0187505 A1* | 7/2010 | Stoessel et al. | 257/40 |

FOREIGN PATENT DOCUMENTS

| | | |
|---|---|---|
| KR | 1020070061804 | 6/2007 |
| KR | 1020070093401 | 9/2007 |
| KR | 1020070115167 | 12/2007 |

OTHER PUBLICATIONS

English Abstract for Pat. Pub. No. KR 1020070093401.
English Abstract for Pat. Pub. No. KR 1020070061804.
English Abstract for Pat. Pub. No. JP 2007-027578.

* cited by examiner

DISPLAY DEVICE INCLUDING ORGANIC LIGHT-EMITTING TRANSISTOR AND A FLUORECENT PATTERN AND METHOD OF FABRICATING THE DISPLAY DEVICE

This application claims priority from Korean Patent Application No. 10-2008-0133719 filed on Dec. 24, 2008 in the Korean Intellectual Property Office, the disclosure of which is incorporated herein by reference in its entirety.

BACKGROUND OF THE DISCLOSURE

1. Field of the Disclosure

The present disclosure relates to a display device including an organic light-emitting transistor.

2. Description of the Related Art

In display devices including organic light-emitting diodes, light is emitted when electrons and holes combine to create electron-hole pairs in a semiconductor or when carriers are excited to a higher energy state and then drop to a bottom state, i.e., a stabilization state.

Unlike liquid crystal displays (LCDs) that are driven using a voltage driving method, organic light-emitting diodes are driven using a current driving method. Thus, additional elements are required to control light-emitting diodes.

As elements for controlling organic light-emitting diodes, at least two transistors including a selection transistor, which selects pixels, and a driving transistor, which drives organic light-emitting diodes, are required. Currently, research is being conducted on a control element including two transistors and a capacitor and a control element including four transistors and two capacitors.

When elements for controlling organic light-emitting diodes are installed, however, the pixel area is significantly reduced. For this reason, a display device using an organic light-emitting transistor, which has both a transistor function and a light-emitting function, is being researched.

SUMMARY OF THE DISCLOSURE

Aspects of the present disclosure provide a display device which has a longer life and can be fabricated simply relative to conventional display devices.

Aspects of the present disclosure also provide a method of fabricating a display device which has a longer life and can be fabricated simply relative to conventional display devices.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a display device including: a substrate which includes first through third subpixel regions; first through third organic light-emitting transistors which are disposed in the first through third subpixel regions, respectively, and are operable to emit light of a first color; and a first fluorescent pattern which is formed on the first organic light-emitting transistor and is operable to cause light of a second color to be emitted.

According to another aspect of the present disclosure, there is provided a method of fabricating a display device. The method includes: providing a substrate which includes first through third subpixel regions; forming first through third organic light-emitting transistors, which are operable to emit light of a first color, in the first through third subpixel regions, respectively; and forming a first fluorescent pattern, which is operable to cause light of a second color to be emitted, on the first organic light-emitting transistor.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE DISCLOSURE

Figure 1:
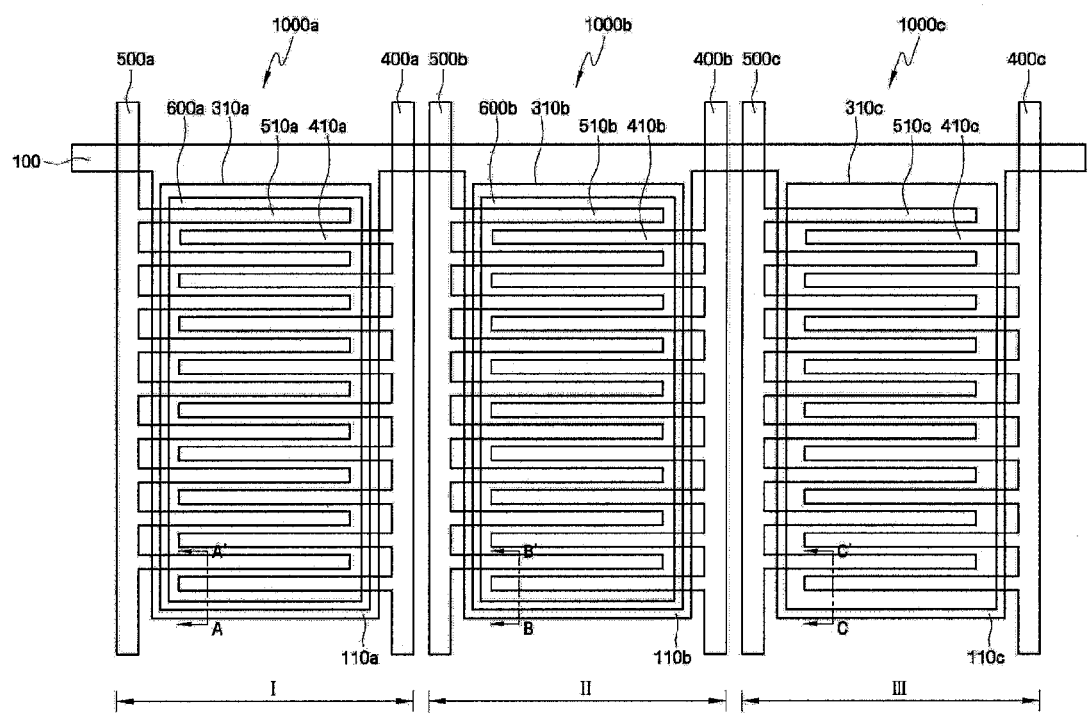
FIG. 1 is a layout diagram of a display device according to a first embodiment of the present disclosure.

Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims. In some embodiments, well-known processing processes, well-known structures and well-known technologies will not be specifically described in order to avoid ambiguous interpretation of the present disclosure. Like reference numerals refer to like elements throughout the specification.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

Spatially relative terms, such as "below," "beneath," "lower," "above," "upper," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or components would then be oriented "above" the other elements or components. Thus, the exemplary term "below" or "beneath" can encompass both an orientation of above and below. The device may be otherwise oriented and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Embodiments of the disclosure are described herein with reference to (plan and) cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the disclosure.

Figure 2:
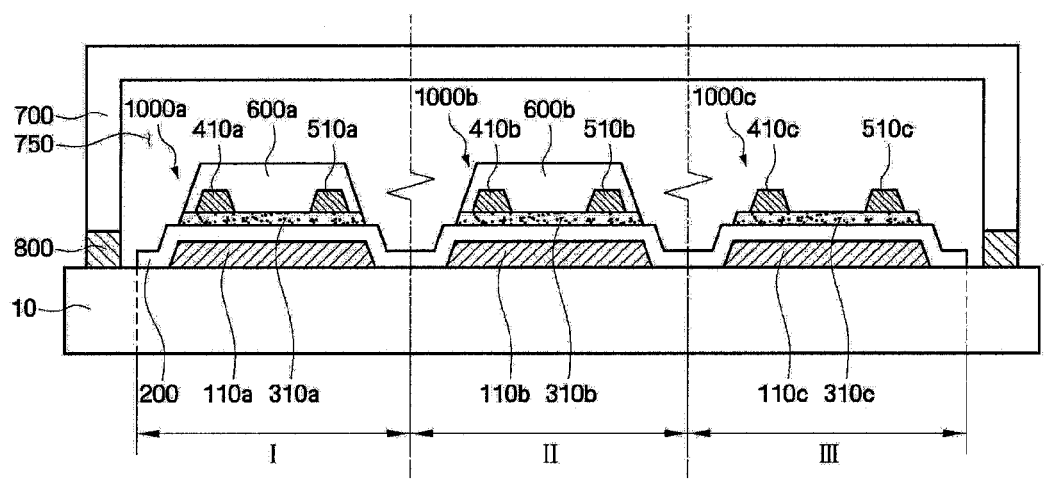
FIG. 2 is a cross-sectional view of the display device according to the first embodiment of the present disclosure, taken along the lines A-A', B-B', and C-C' of FIG. 1.

Hereinafter, a display device according to a first embodiment of the present disclosure will be described in detail with reference to FIGS. 1 and 2. FIG. 1 is a layout diagram of the display device according to the first embodiment of the present disclosure. FIG. 2 is a cross-sectional view of the display device according to the first embodiment of the present disclosure, taken along the lines A-A', B-B', and C-C' of FIG. 1.

Referring to FIGS. 1 and 2, the display device according to the present embodiment includes a pixel region on a substrate 10, and the pixel region is divided into first through third subpixel regions I through III.

The substrate 10 may be a rigid or flexible substrate made of a material such as glass, quartz, polyethylene, polypropylene, polyethyleneterephthalate, polymethacrylate, polymethyl methacrylate, polymethylacrylate, polyester, polycarbonate, or the like.

The first through third subpixel regions I through III may represent a red-based color, a green-based color, and a blue-based color, respectively. The first through third subpixel regions I through III may be arranged in a stripe, mosaic, or delta form.

The first through third subpixel regions I through III according to the present embodiment include first through third organic light-emitting transistors 1000a through 1000c, respectively, and first and second fluorescent patterns 600a and 600b are formed on the first and second organic light-emitting transistors 1000a and 1000b, respectively. The first organic light-emitting transistor 1000a has a three-electrode structure composed of a first gate electrode 110a, first source electrodes 410a, and first drain electrodes 510a. In addition, a first organic semiconductor pattern 310a is interposed between the first source electrodes 410a and the first drain electrodes 510a to move electric charges and emit light. The second and third organic light-emitting transistors 1000b and 1000c have the same structure as the first organic light-emitting transistor 1000a.

A gate line 100 extends horizontally on the substrate 10, and the first gate electrode 110a and second and third gate electrodes 110b and 110c branch off from the gate line 100 in the first through third subpixel regions I through III, respectively.

The gate line 100 and the first through third gate electrodes 110a through 110c according to the present embodiment may directly contact the substrate 10.

The gate line 100 and the first through third gate electrodes 110a through 110c may be made of metal or a conductive polymer. In this case, examples of the metal may include aluminum (Al), silver (Ag), molybdenum (Mo), copper (Cu), and titanium (Ti). When double-sided light emission is required, a transparent electrode, such as indium tin oxide (ITO), indium zinc oxide (IZO), tin oxide (SnO2) or zinc oxide (ZnO), may be used. In addition, examples of the conductive polymer may include polyaniline, polyacetylene, polyalkyllthiophene derivatives, and polysilane derivatives.

A gate insulating film 200 is formed on the gate line 100, the first through third gate electrodes 110a through 110c, and the substrate 10.

The gate insulating film 200 may be made of an organic or inorganic material. Examples of the inorganic material may include SnO2, silicon nitride (SiNx), and aluminum oxide (Al2O3). In addition, examples of the organic material may include polychloroprene, polyethyleneterephthalate, polyoxymethylene, polyvinyl chloride, polyvinylidene chloride, cyanoethyl flurane, polymethyl methacrylate, polyvinyl phenol, polysulfone, polycarbonate, and polyimide.

The first organic semiconductor pattern 310a and second and third organic semiconductor patterns 310b and 310c are formed on the gate insulating film 200 in the first through third subpixel regions I through III, respectively.

The first through third organic semiconductor patterns 310a through 310c according to the present embodiment may be made of materials having superior charge mobility and light-emitting properties. The first through third organic semiconductor patterns 310a through 310c according to the present embodiment may all be made of the same material. Accordingly, the first through third organic semiconductor patterns 310a through 310c have the same lifetime, and thus a phenomenon, in which a pixel representing a color deteriorates earlier than the other pixels and causes defects in the display device, can be prevented. When the first through third organic semiconductor patterns 310a through 310c are made of a semiconductor material that represents a color with the longest lifetime, the performance of the display device can be improved. The first through third organic semiconductor patterns 310a through 310c may represent, for example, a first color, and the first color may be blue.

The first through third organic semiconductor patterns 310a through 310c according to the present embodiment may be made of a material which is a combination of first- and second-type semiconductors. That is, each of the first through third organic semiconductor patterns 310a through 310c may be made of an ambipolar organic semiconductor material which is a composite of, e.g., a p-type semiconductor and an n-type semiconductor. However, the present disclosure is not limited thereto, and each of the first through third organic semiconductor patterns 310a and 310c may also be made of a unipolar organic semiconductor material of any type. Specifically, each of the first through third organic semiconductor patterns 310a through 310c may be made of one or more of an acene-based material, a thiophene-based material, a fluorine-based material, a polyphenylenevinylene (PPV)-based material, and a perylene-based material. The first through third organic semiconductor patterns 310a through 310c may have a band gap of 3 eV or less.

The above organic semiconductors may have, for example, a bulk heterojunction structure composed of a composite of formulas (1) and (2), a composite of formulas (1) and (3), a composite of formulas (1) and (4), and a composite of formulas (1) and (5).

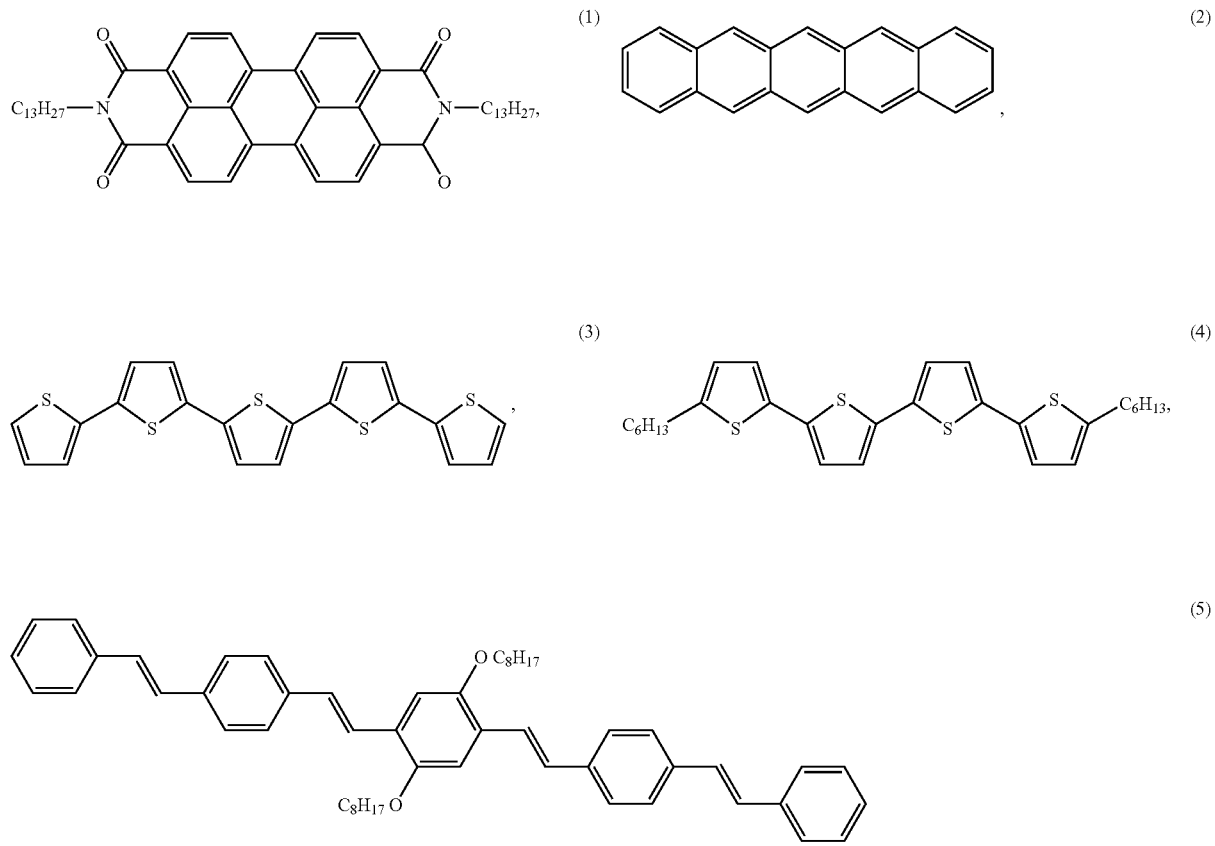

Formula (1) is an organic semiconductor which is of the n type and emits blue light. Formulas (2) through (5) are organic semiconductors which are of the p type and emit red light. Formulas (1) through (5) denote P13, pentacene, α–75, DH4T, and O-octyl-OPV5, respectively.

In addition, the organic semiconductors may be made of materials of formulas (6) through (9) having intrinsic ambipolarity.

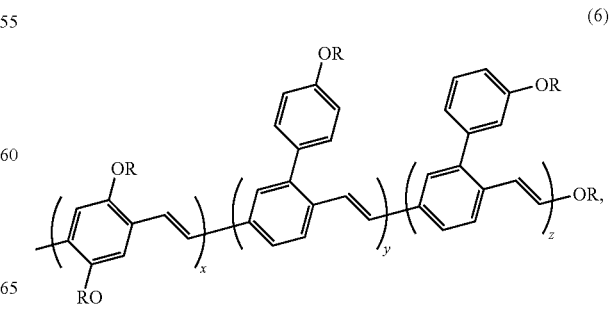

where x, y, and z are natural numbers.

(7)

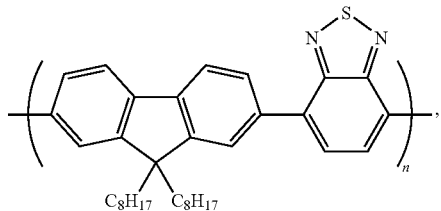

where n is a natural number.

(8)

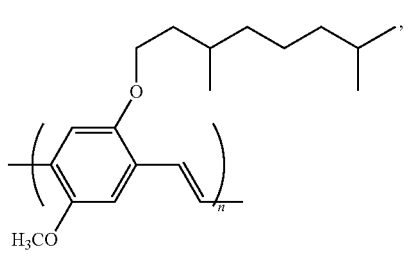

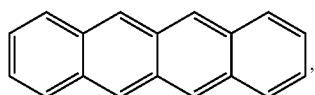
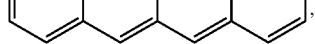

where n is a natural number.

(9)

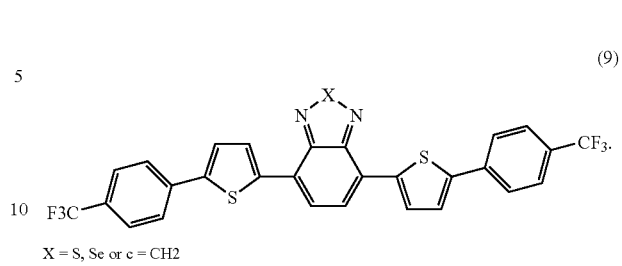

X = S, Se or c = CH2

Formulas (6) through (8) represent a red-based color, specifically, violet, and formula (9) represents blue. In addition, formulas (6) through (9) represent super yellow, F8BT, OC1C10-polyphenylene vinylene (PPV), and dithienylbenzothiadiazole derivatives, respectively.

The organic semiconductors according to the present embodiment may be made of unipolar materials of formulas (10) through (17) below. The materials of formulas (10) through (17) are of the p type and represent red.

(10)

(11)

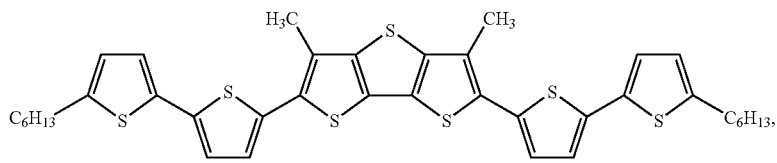

(12)

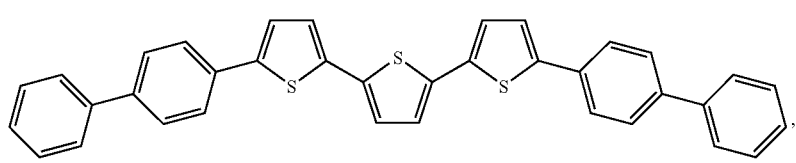

(13)

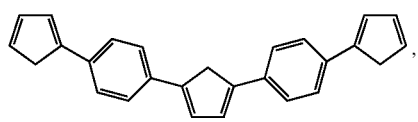

(14)

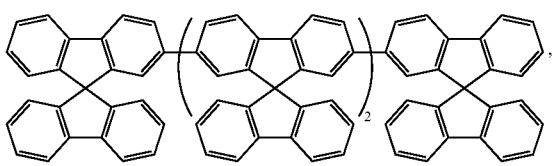

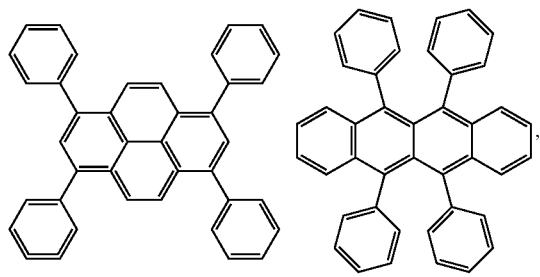 (15)

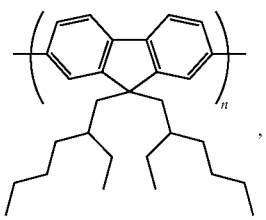 (16)

where n is a natural number.

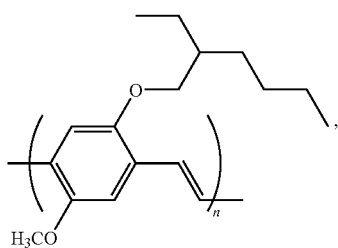 (17)

where n is a natural number.

Formulas (10) through (17) represent tetracene, DTT7Me, BP3T, TPTPT, ter (9,9'-spirobifluorene), rubrene-doped TPPy, poly(9,9'-dialkylfluorene), and MEH-PPV, respectively.

The first organic semiconductor pattern 310a may function as a hole-transporting layer, a hole-injection layer, an emitting material layer, an electron injection layer, and an electron-transporting layer. Alternatively, a separate material may be formed on the first organic semiconductor pattern 310a and function as a hole-transporting layer, an electron-transporting layer, an emitting material layer, and the like.

The first drain electrodes 510a are disposed on a side of a top surface of the first organic semiconductor pattern 310a, and the first source electrodes 410a are disposed on the other side of the top surface of the first organic semiconductor pattern 310a. The first drain electrodes 510a face and are separated from the first source electrodes 410a, respectively. The first drain electrodes 510a and the first source electrodes 410a may lie in the same plane and face each other in a horizontal direction. In the present specification, the phrase 'the first drain electrodes 510a and the first source electrodes 410a face each other in a horizontal direction' excludes the possibility that the first drain electrodes 510a and the first source electrodes 410a overlap each other in a vertical direction and that the first organic semiconductor pattern 310a is vertically interposed between the first drain electrodes 510a and the first source electrodes 410a. The phrase may be understood that, although the first drain electrodes 510a and the first sources 410a are not formed in the same plane, they face each other in the horizontal direction as long as they do not overlap each other in the vertical direction.

The first drain electrodes 510a branch off from a first drain line 500a to overlap the first gate electrode 110a. The first source electrodes 410a branch off from a source line 400a to overlap the first gate electrode 110a. The first drain electrodes 510a and the first source electrodes 410a may be alternately arranged.

The first drain electrodes 510a may be used as electron injection electrodes. In this case, the first drain electrodes 510a may be made of a material having a lower work function than that of a material of the first source electrodes 410a. For example, the first drain electrodes 510a may be a monolayer or a multiplayer which is made of one or more of the following materials: a metal material such as aluminum or silver, a metal alloy such as a magnesium alloy (e.g., magnesium silver (MgAg)), an aluminum alloy (e.g., aluminum lithium (AlLi), aluminum calcium (AlCa) or aluminum magnesium (AlMg)), an alkali metal material such as lithium or calcium, and an alkali metal alloy such as lithium fluoride (LiF).

The first source electrodes 410a may be used as hole injection electrodes. In this case, the first source electrodes 410a may be made of a material having a higher work function than that of the material of the first drain electrodes 510a. For example, the first source electrodes 410a may be a monolayer or a multilayer which is made of one or more of the following materials: a transparent conductive material, such as ITO, indium oxide, IZO, SnO2 or zinc oxide (ZnO), and a conductive polymer such as polyaniline, polyacetylene, polyalkylthiophene derivatives, or polysilane derivatives.

The second and third source electrodes 410b and 410c, the second and third drain electrodes 510b and 510b, second and third source lines 400b and 400c, and second and third drain lines 500b and 500c may be made of the same materials and have the same structures as the first source electrodes 410a, the first drain electrodes 510a, the first source line 400a, and the first drain line 500a, respectively.

The first and second fluorescent patterns 600a and 600b are formed on the first and second organic light-emitting transistors 1000a and 1000b, respectively. Each of the first and second fluorescent patterns 600a and 600b may be made of one or more of a sulfide-based material, a silicate-based material, a nitride-based material, a barium oxygen silicon europium (BOSE)-based material, and a garnet-based material such as terbium aluminum garnet (TAG) or yttrium aluminum garnet (YAG). Each of the first and second fluorescent patterns 600a and 600b may be made of a fluorescent material having a particle size of 10 nm to 990 μm.

When the first through third organic semiconductor patterns 310a through 310c emit light of the first color, the first fluorescent pattern 600a may cause light of a second color to be emitted which is different from the first color. Here, if the first color is blue, the second color may be red. Accordingly, red-based light is emitted from the first subpixel region I.

When the first through third organic semiconductor patterns 310a through 310c emit light of the first color, the second fluorescent pattern 600b may cause light of a third color to be emitted which is different from both the first and second colors. Here, if the first and second colors are blue and red, respectively, the third color may be green. Accordingly, green-based light is emitted from the second subpixel region II.

No fluorescent pattern is formed on the third organic semiconductor pattern 310c. Therefore, light of the first color, e.g., blue-based light, is emitted from the third subpixel region III.

Hence, red light, green light and blue light are emitted from the first through third subpixel regions I through III, respectively, to form a unit pixel.

An encapsulation substrate 700 may further be provided to cover all of the first through third organic light-emitting transistors 1000a through 1000c and the first and second fluorescent patterns 600a and 600b. The encapsulation substrate 700 may be made of any one or more of a silicon-based material, an acryl-based material, a melamine-based material, an epoxy-based material, an imide-based material, an ester-based material, a nitride, and an oxide. The encapsulation substrate 700 protects the first through third organic light-emitting transistors 1000a through 1000c and the first and second fluorescent patterns 600a and 600b from moisture.

The encapsulation substrate 700 is adhered to the substrate 10 by a sealant 800.

The encapsulation substrate 700 may be separated from the first through third organic light-emitting transistors 1000a through 1000c and the first and second fluorescent patterns 600a and 600b by a space 750, and a dehumidifying agent may be disposed in the space 750.

Figure 3:
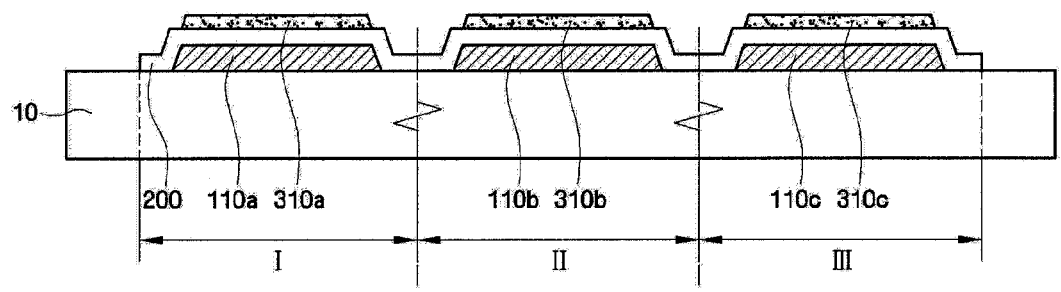
FIGS. 3 through 5 are cross-sectional views sequentially showing processes included in a method of fabricating the display device according to the first embodiment of the present disclosure.
Figure 4:
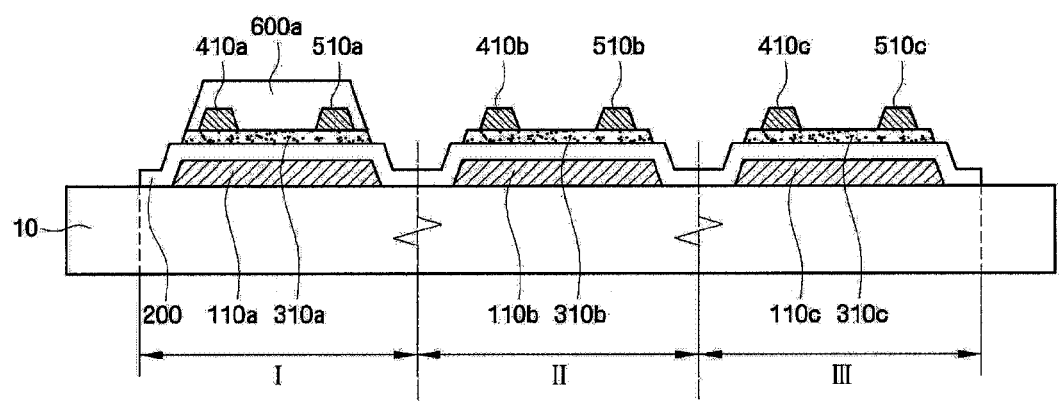
Figure 5:
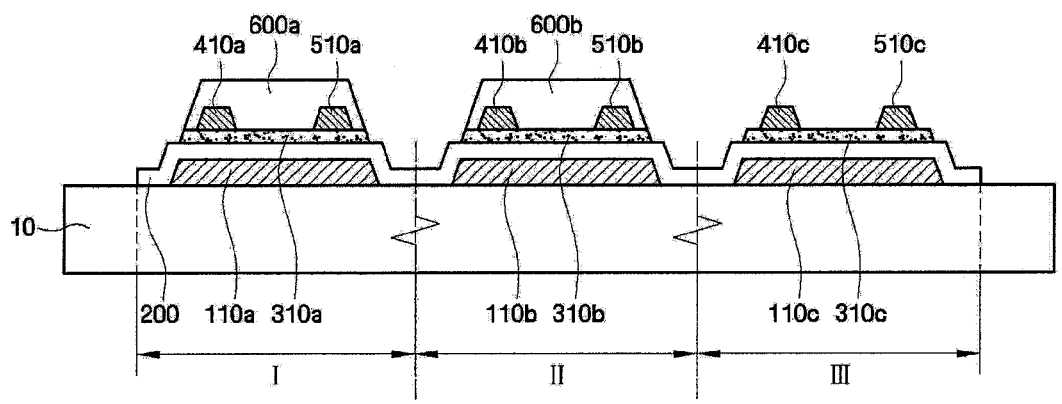

Hereinafter, a method of fabricating the display device according to the first embodiment of the present disclosure will be described in detail with reference to FIGS. 1 through 5. In the following embodiments, elements having the same functions as those illustrated in the drawings for the display device according to the first embodiment are indicated by like reference numerals, and thus their description will be omitted or simplified. FIGS. 3 through 5 are cross-sectional views sequentially showing processes included in the method of fabricating the display device according to the first embodiment of the present disclosure.

Referring to FIGS. 1 and 3, the substrate 10 including the first through third subpixel regions I through III is provided.

Then, the gate line 100 is formed on the substrate 10 to extend horizontally. In addition, the first through third gate electrodes 110a through 110c are formed in the first through third subpixel regions I through III, respectively. Here, the gate line 100 and the first through third gate electrodes 110a through 110c may be formed using vacuum evaporation, sputtering, chemical vapor deposition (CVD), or coating.

Next, the gate insulating film 200 is formed using, e.g., sputtering or CVD, to cover the gate line 100, the first through third gate electrodes 110a through 110c, and the substrate 10.

On the gate insulating film 200, the first through third organic semiconductor patterns 310a through 310c are formed of the same material in the first through third subpixel regions I through III, respectively. Here, the first through third organic semiconductor patterns 310a through 310c may be formed using any one of photolithography, vacuum evaporation, spin coating, dip coating, inkjet printing, and stamping.

The forming of the first through third organic semiconductor patterns 310a through 310c may include forming an organic semiconductor layer (not shown), which emits light of the first color, on the substrate 10 and simultaneously forming the first through third organic semiconductor patterns 310a through 310c by patterning the organic semiconductor layer. Since the first through third organic semiconductor patterns 310a through 310c can be simultaneously formed of the same material, the process of forming the first through third organic semiconductor patterns 310a through 310c is simplified.

The forming of the first through third organic semiconductor patterns 310a through 310c may include injecting an organic semiconductor material, which emits light of the first color, into the first through third subpixel regions I through III by using an inkjet method. In this case, since an organic semiconductor material contained in a single inkjet device is injected into all of the first through third subpixel regions I through III, there is no need to use a plurality of inkjet devices. As a result, the time required for the injection of the organic semiconductor material can be reduced.

Referring to FIG. 4, the first through third source electrodes 410a through 410c, the first through third drain electrodes 510a through 510c, the first through third source lines 400a through 400c, and the first through third drain lines 500a through 500c are formed using sputtering, CVD, coating, or the like. The first through third source electrodes 410a through 410c and the first through third drain electrodes 510a through 510c are formed on the first through third organic semiconductor patterns 310a through 310c, respectively, and lie in the same plane.

Next, the first fluorescent pattern 600a is formed on the first organic semiconductor pattern 310a. The first fluorescent pattern 600a may be operable to cause light of the second color to be emitted which is different from the first color. In this case, the second and third subpixel regions II and III are not coated with a fluorescent material that is operable to cause light of the second color to be emitted.

Referring to FIG. 5, the second fluorescent pattern 600b is formed on the second organic semiconductor pattern 310b. The second fluorescent pattern 600b may be operable to cause light of the third color to be emitted which is different from the first and second colors. In this case, the first and third subpixel regions I and III are not coated with a fluorescent material that is operable to cause light of the second color to be emitted. A case where the second fluorescent pattern 600b is formed after the first fluorescent pattern 600a is formed has been described above as an example. However, the second fluorescent pattern 600b may also be formed before the first fluorescent pattern 600a. In this case, no fluorescent material is formed in the third subpixel region III.

Referring to FIG. 2, the encapsulation substrate 700 is adhered to the substrate 10, thereby completing the display device according to the present embodiment.

Figure 6:
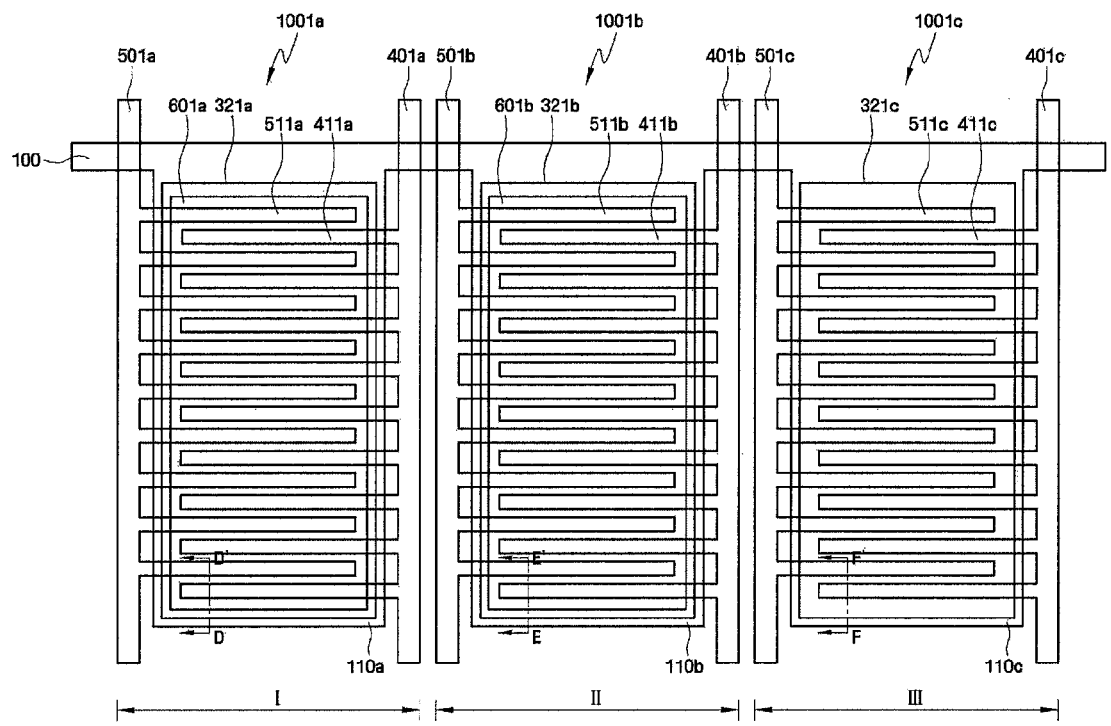
FIG. 6 is a layout diagram of a display device according to a second embodiment of the present disclosure.
Figure 7:
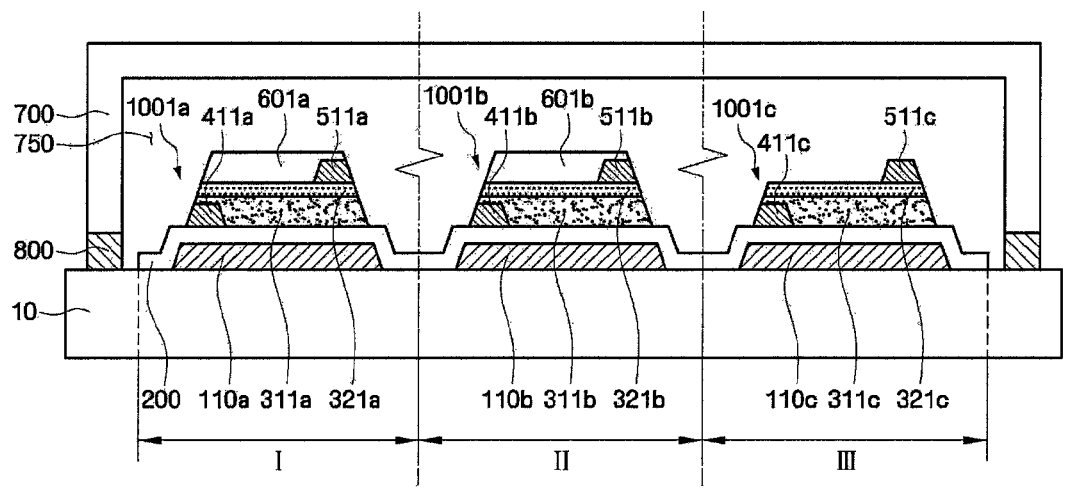
FIG. 7 is a cross-sectional view of the display device according to the second embodiment of the present disclosure, taken along the lines D-D', E-E', and F-F' of FIG. 6.

Hereinafter, a display device according to a second embodiment of the present disclosure will be described in detail with reference to FIGS. 6 and 7. FIG. 6 is a layout diagram of the display device according to the second embodiment of the present disclosure. FIG. 7 is a cross-sectional view of the display device according to the second embodiment of the present disclosure, taken along the lines D-D', E-E', and F-F' of FIG. 6.

Referring to FIGS. 6 and 7, a first organic light-emitting transistor 1001a according to the present embodiment may include a first-type organic semiconductor pattern 311a and a second-type organic semiconductor pattern 321a. That is, the first organic light-emitting transistor 1001a may have a heterostructure including the first-type organic semiconductor pattern 311a and the second organic semiconductor pattern 321a stacked sequentially. Here, the first type may be a p type, and the second type may be an n type. The first-type organic semiconductor pattern 311a may contact first source electrodes 411a, and the second-type organic semiconductor pattern 321a may contact first drain electrodes 511a. A second organic light-emitting transistor 1001b may include a second-type organic semiconductor pattern 311b and a second-type organic semiconductor pattern 321b. In addition, a third organic light-emitting transistor 1001c may include a third-type organic semiconductor pattern 311a and a second-type organic semiconductor pattern 321c.

The first-type organic semiconductor pattern 311a and the first source electrodes 411a may be formed on a gate insulating film 200. The first-type organic semiconductor pattern 311a may contact a side surface and/or a top surface of each of the first source electrodes 411a. That is, the first source electrodes 411a may be disposed on a side surface of and/or under a side of the first-type organic semiconductor pattern 311a. The second-type organic semiconductor pattern 321a may be disposed on the first-type organic semiconductor pattern 311a and thus overlap the first-type organic semiconductor pattern 311a. The first drain electrodes 511a may be formed on a side (e.g., a top surface) of the second-type organic semiconductor pattern 321a that is opposite the side of the second type organic semiconductor pattern 321a which contacts the first-type organic semiconductor pattern 311a. The first drain electrodes 511a do not vertically overlap the first source electrodes 411a. Although the first drain electrodes 511a and the first source electrodes 411a are not formed in the same plane, they are, on the whole, horizontally spaced apart from each other. Light is emitted from a region in which the first-type organic semiconductor pattern 311a is overlapped by the second-type organic semiconductor pattern 321a.

Second and third source electrodes 411b and 411c, second and third drain electrodes 511b and 511c, second and third source lines 401b and 401c, and second and third drain lines 501b and 501c may be made of the same materials and have the same structures as the first source electrodes 411a, the first drain electrodes 511a, a first source line 401a, and a first drain line 501a, respectively.

The present embodiment is identical to the previous embodiment in that first and second fluorescent patterns 601a and 601b are formed on the first and second organic light-emitting transistors 1001a and 1001b, respectively, and that no fluorescent pattern is formed on the third organic light-emitting transistor 1001c.

Hereinafter, a method of fabricating the display device according to the second embodiment of the present disclosure will be described in detail with reference to FIGS. 6 through 13. FIGS. 8 through 13 are cross-sectional views sequentially showing processes included in the method of fabricating the display device according to the second embodiment of the present disclosure.

Figure 8:
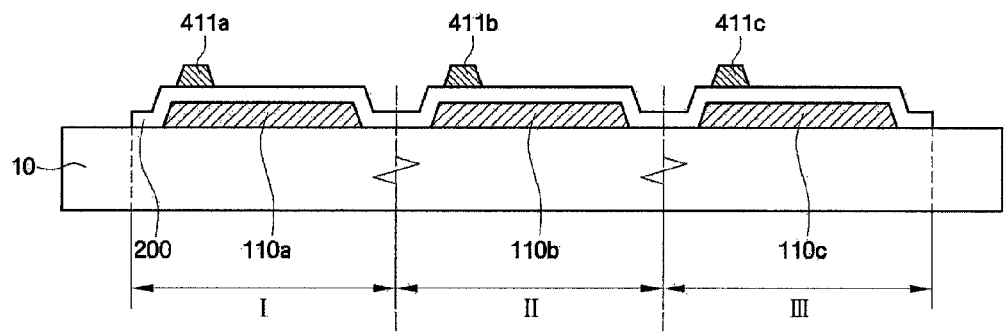
FIGS. 8 through 13 are cross-sectional views sequentially showing processes included in a method of fabricating the display device according to the second embodiment of the present disclosure.

Referring to FIGS. 6 and 8, the gate insulating film 200 is formed on first through third gate electrodes 110a through 110c. Then, the first through third source electrodes 411a through 411c are formed on the gate insulating film 200 in first through third subpixel regions I through III, respectively.

Figure 9:
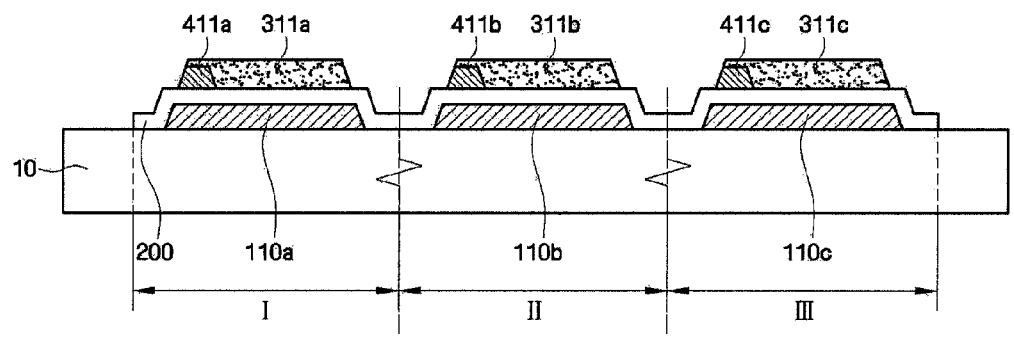

Referring to FIG. 9, the first-type organic semiconductor patterns 311a through 311c are formed to contact the first through third source electrodes 411a through 411c, respectively.

Figure 10:
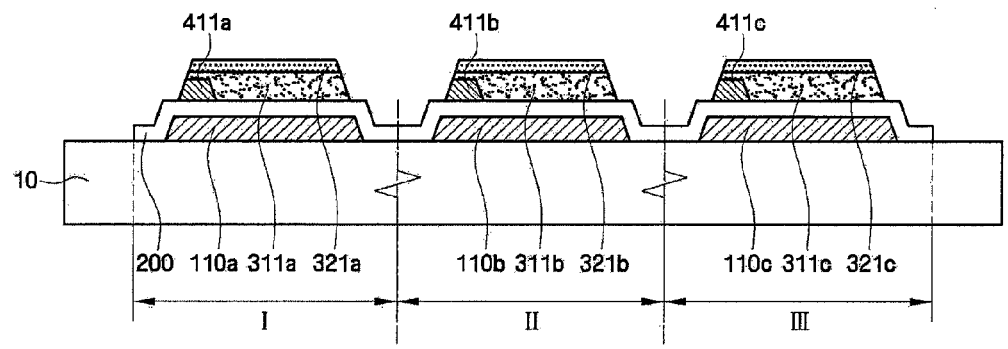

Referring to FIG. 10, the second-type organic semiconductor patterns 321a through 321c are formed on the first-type organic semiconductor patterns 311a through 311c, respectively, to overlap the first-type organic semiconductor patterns 311a through 311c, respectively. Here, the first type organic semiconductor patterns 311a through 311c are opposite to the second type organic semiconductor patterns 321a through 321c.

Figure 11:
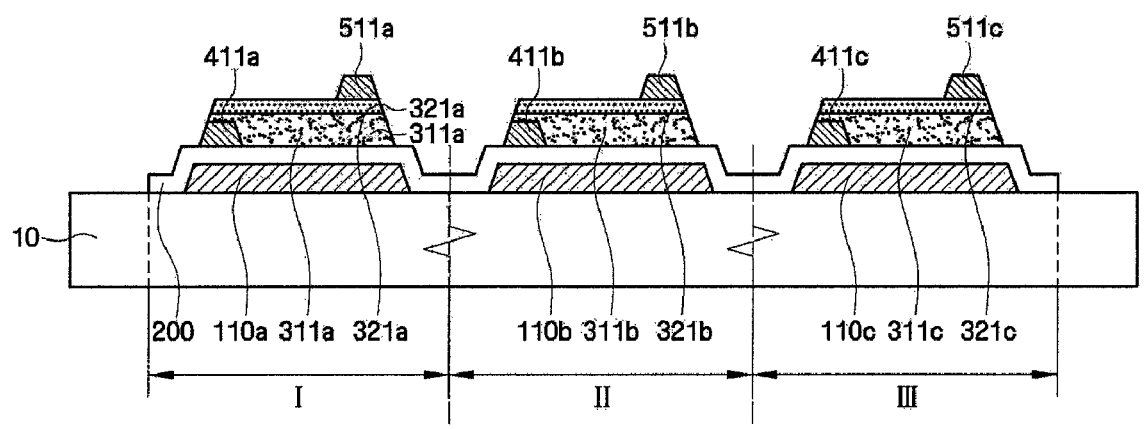

Referring to FIG. 11, the first through third drain electrodes 511a through 511c are formed on the second-type organic semiconductor patterns 321a through 321c, respectively. In this case, the first through third source electrodes 411a through 411c are not vertically overlapped by the first through third drain electrodes 511a through 511c, respectively.

Figure 12:
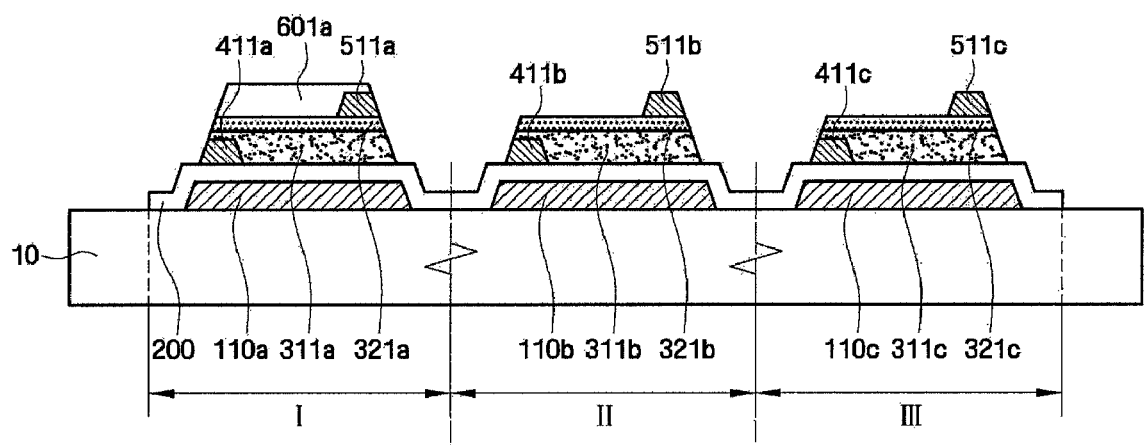

Referring to FIG. 12, the first fluorescent pattern 601a is formed on the second-type organic semiconductor pattern 321a and the first drain electrodes 511a in the first subpixel region I.

Figure 13:
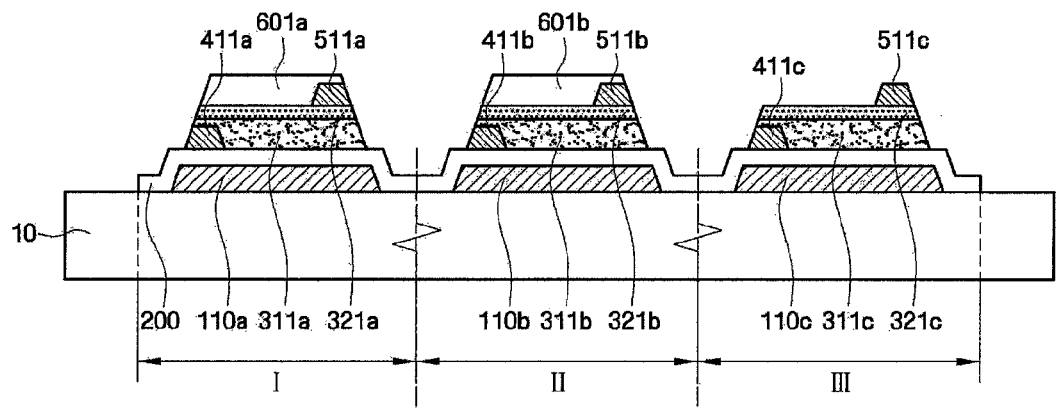

Referring to FIG. 13, the second fluorescent pattern 601b is formed on the second-type organic semiconductor pattern 321b and the second drain electrodes 511b in the second subpixel region II. The order in which the first and second fluorescent patterns 601a and 601b are formed can be reversed, and no fluorescent pattern is formed in the third subpixel region III.

Referring to FIG. 7, an encapsulation substrate 700 is adhered to a substrate 10.

Figure 14:
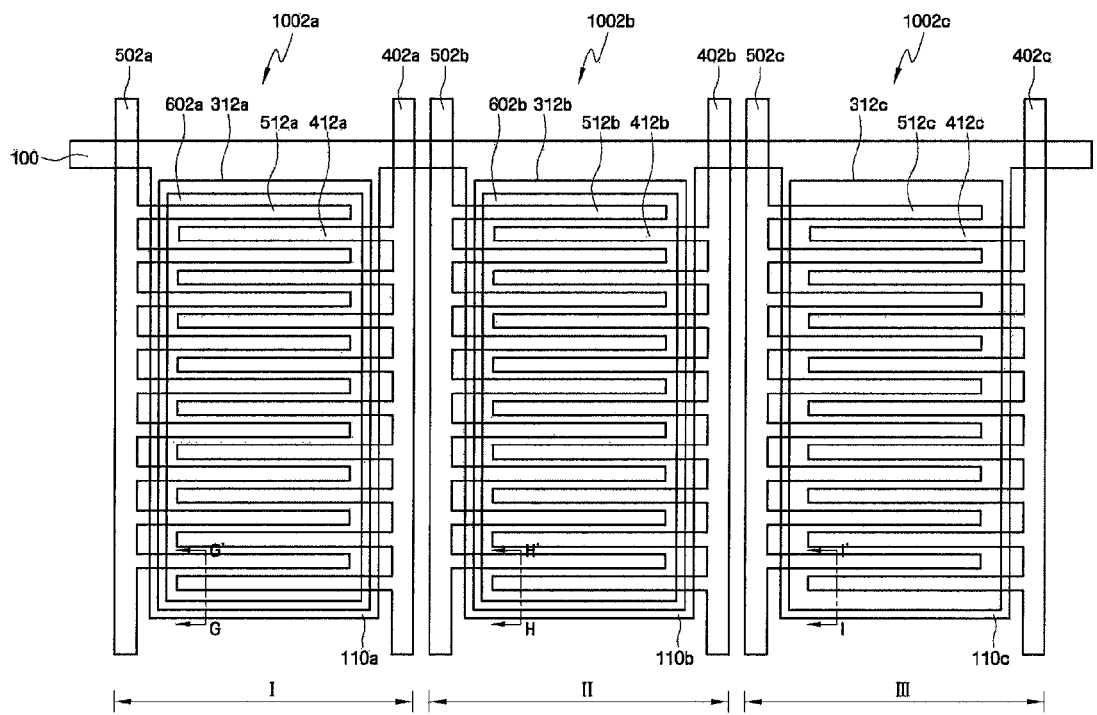
FIG. 14 is a layout diagram of a display device according to a third embodiment of the present disclosure.
Figure 15:
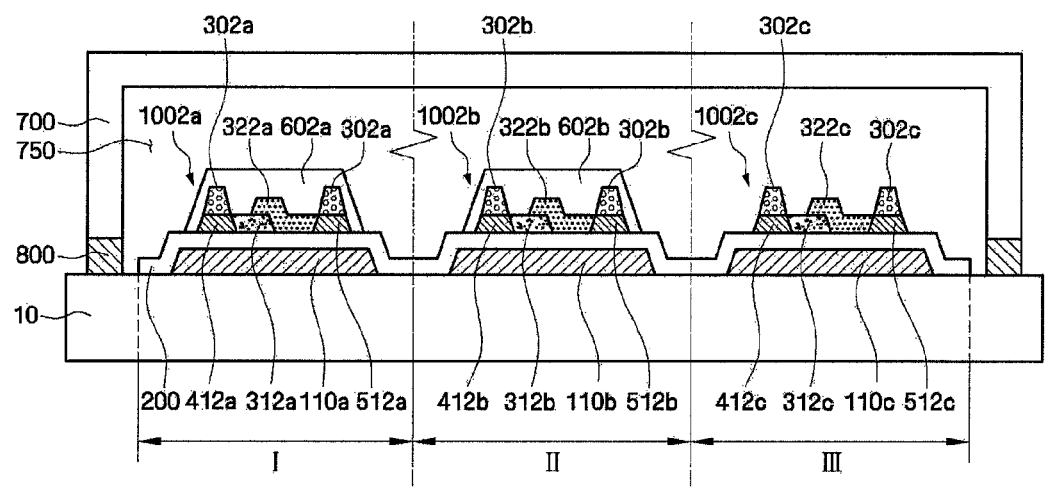
FIG. 15 is a cross-sectional view of the display device according to the third embodiment of the present disclosure, taken along the lines G-G', H-H', and I-I' of FIG. 14.

Hereinafter, a display device according to a third embodiment of the present disclosure will be described in detail with reference to FIGS. 14 and 15. FIG. 14 is a layout diagram of the display device according to the third embodiment of the present disclosure. FIG. 15 is a cross-sectional view of the display device according to the third embodiment of the present disclosure, taken along the lines G-G', H-H', and I-I' of FIG. 14.

Referring to FIGS. 14 and 15, first source electrodes 412a and first drain electrodes 512a according to the present embodiment are formed on a gate insulating film 200 to be in the same plane.

A first organic light-emitting transistor 1002a according to the present embodiment may include a first-type organic semiconductor pattern 312a and a second-type organic semiconductor pattern 322a. That is, a heterostructure of the first-type organic semiconductor pattern 312a and the second-type organic semiconductor pattern 322a may be provided in the present embodiment.

The first-type organic semiconductor pattern 312a is formed on the gate insulating film 200 and lies in the same plane with the first source electrodes 412a such that a side of the first-type organic semiconductor pattern 312a contacts the first source electrodes 412a. Here, the first-type organic semiconductor pattern 312a does not contact the first drain electrodes 512a. The second-type organic semiconductor 322a is also formed on the gate insulating film 200 and has a side that contacts the first drain electrodes 512a. The second-type organic semiconductor pattern 322a does not contact the first source electrodes 412a but has portions that contact the first-type organic semiconductor pattern 312a.

Mask patterns 302a through 302c may be formed on the first source electrodes 412a and second and third source electrodes 412b and 412c, respectively, and the first drain electrodes 512a and second and third drain electrodes 512b and 512c, respectively. Here, the first through third source electrodes 412a through 412c have the same structure, and the first through third drain electrodes 512a through 512c have the same structure.

Like the first organic light-emitting transistor 1002a, second and third organic light-emitting transistors 1002b and 1002c include first-type organic semiconductor patterns 312b and 312c and second-type organic semiconductor patterns 322b and 322c, respectively.

Reference numerals 402a through 402c indicate first through third source lines, respectively, and reference numerals 502a through 502c indicate first through third drain lines, respectively.

Hereinafter, a method of fabricating the display device according to the third embodiment of the present disclosure will be described in detail with reference to FIGS. 14 through 19.

Figure 16:
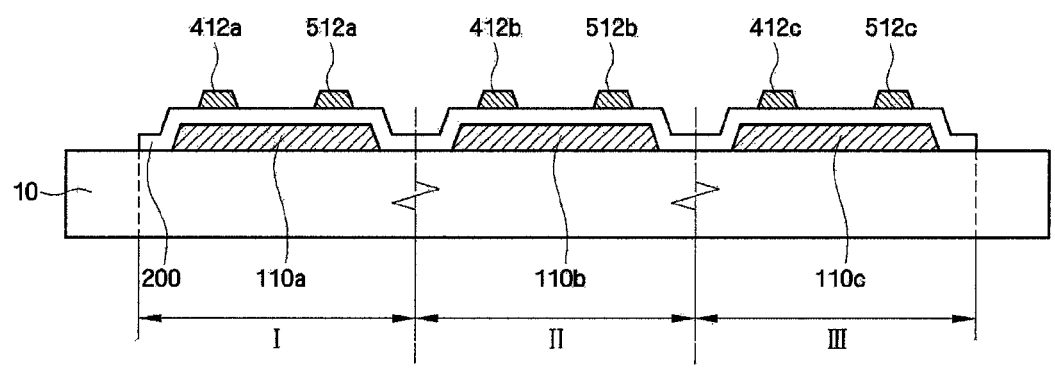
FIGS. 16 through 19 are cross-sectional views sequentially showing processes included in a method of fabricating the display device according to the third embodiment of the present disclosure.

Referring to FIGS. 14 and 16, the first through third source electrodes 412a through 412c and the first through third drain electrodes 512a through 512c are formed on the gate insulating film 200 and lie in the same plane.

Figure 17:
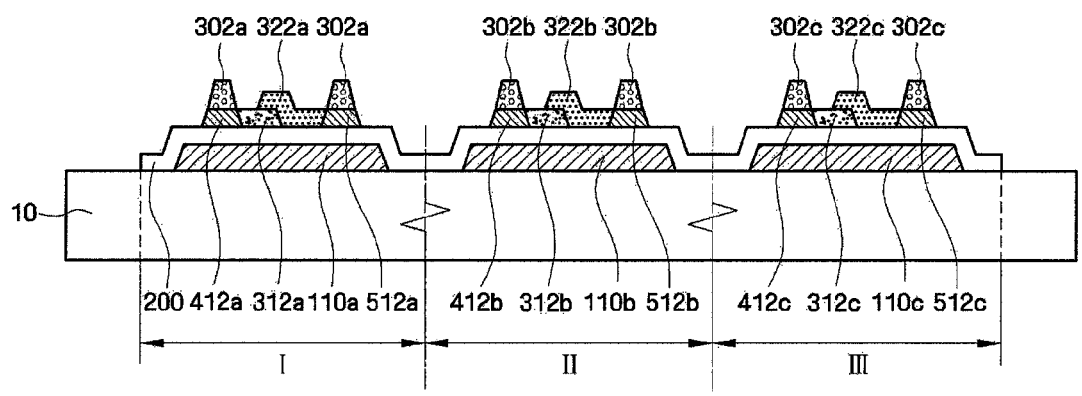

Referring to FIG. 17, when the mask patterns 302a through 302c are respectively formed on one of a group of the first through third source electrodes 412a through 412c and a group of the first through third drain electrodes 512a through 512c, the first-type organic semiconductor pattern 312a is formed. Then, when the mask patterns 302a through 302c are respectively formed on the other one of the group of the first through third source electrodes 412a through 412c and the group of the first through third drain electrodes 512a through 512c, the second-type organic semiconductor pattern 322a may be formed. In this case, the order in which the first-type organic semiconductor pattern 321a and the second-type organic semiconductor pattern 322a are formed can be reversed.

Figure 18:
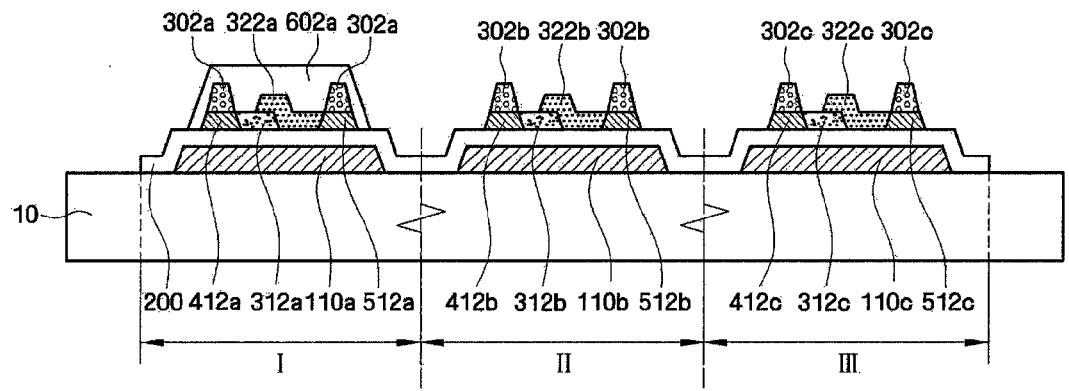

Referring to FIG. 18, a first fluorescent pattern 602a is formed on the gate insulating film 200 in a first subpixel region I to cover the first-type organic semiconductor pattern 312a and the second-type organic semiconductor pattern 322a.

Figure 19:
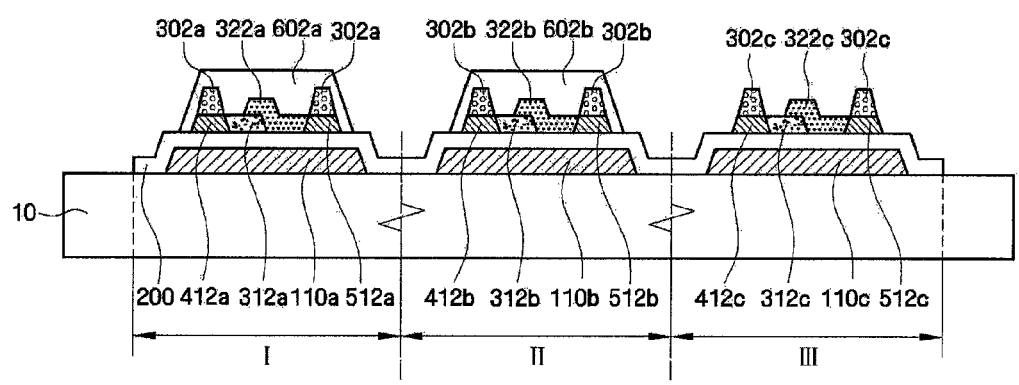

Referring to FIG. 19, a second fluorescent pattern 602b is formed on the gate insulating film 200 in a second subpixel region II to cover the second-type organic semiconductor pattern 312b and the second-type organic semiconductor pattern 322b. In this case, the order in which the first and second fluorescent patterns 602a and 602b are formed can be reversed, and no fluorescent pattern is formed in a third subpixel region III.

Referring to FIG. 15, an encapsulation substrate 700 is adhered to a substrate 10.

Figure 20:
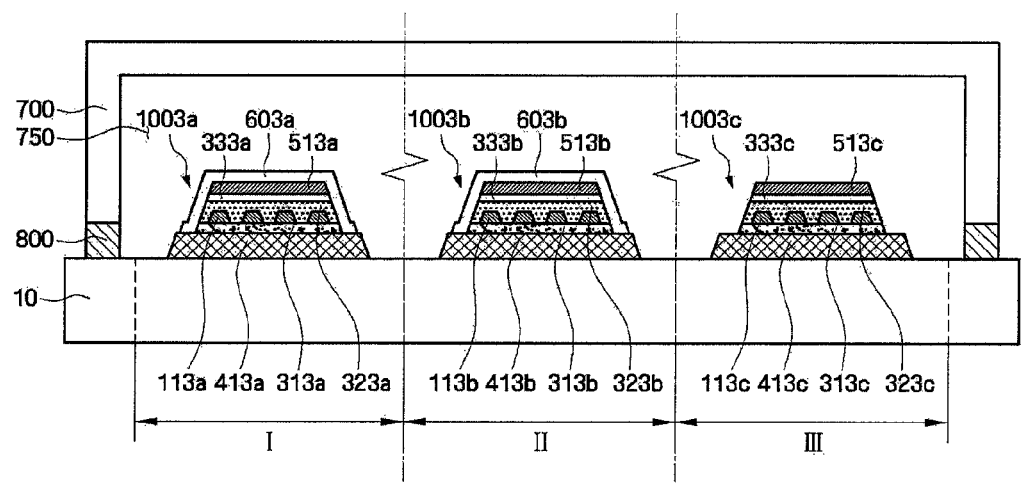
FIG. 20 is a cross-sectional view of a display device according to a fourth embodiment of the present disclosure.

Hereinafter, a display device according to a fourth embodiment of the present disclosure will be described in detail with reference to FIG. 20. FIG. 20 is a cross-sectional view of the display device according to the fourth embodiment of the present disclosure.

Referring to FIG. 20, each of first through third organic light-emitting transistors 1003a through 1003c according to the present embodiment has a structure including a static induction transistor (SIT) combined with an organic light-emitting diode. However, the present disclosure is not limited thereto, and the first through third organic light-emitting transistors 1003a through 1003c may have various structures. For example, each of the first through third organic light-emitting transistors 1003a through 1003c may have a metal-insulator-semiconductor (MIS) structure.

First through third source electrodes 413a through 413c are formed on a substrate 10 according to the present embodiment in first through third subpixel regions I through III, respectively.

A pair of first organic semiconductor patterns 313a and 323a, a pair of second organic semiconductor patterns 313b and 323b, and a pair of third organic semiconductor patterns 313c and 323c are formed on the first through third source electrodes 413a through 413c, respectively, in the first through third subpixel regions I through III, respectively. The pair of the first organic semiconductor patterns 313a and 323a may be formed of a single material at different times. The first organic semiconductor patterns 313a and 323a may be made of the same material as that according to the first embodiment of the present disclosure. For example, the first organic semiconductor patterns 313a and 323a may be made of pentacene or copper phthalocyanine (CuPC).

Gate electrodes 113a may be formed in the first organic semiconductor patterns 313a and 323a and arranged parallel to each other in a grid form. A channel is formed between a first drain electrode 513a and the first source electrode 413a which will be described later. Therefore, when no voltage is applied to the gate electrodes 113a, a predetermined current flows between the first drain electrode 513a and the first source electrode 413a. However, when a predetermined voltage is applied to the gate electrodes 113a, depletion regions expand from the gate electrodes 113a. As a result, a width of the channel, through which electric current flows, is reduced, thereby reducing the amount of current that flows between the first drain electrode 513a and the first source electrode 413a. When a voltage applied to the gate electrodes 113a exceeds a threshold voltage, the depletion regions expanding from the gate electrodes 113a, which are separated from each other, meet each other. Accordingly, the channel between the first drain electrode 513a and the first source electrode 413a is broken, and electric current no longer flows through the channel.

The pair of the first organic semiconductor patterns 313a and 323a have the same structure as the pair of the second organic semiconductor patterns 313b and 323b and the pair of the third organic semiconductor patterns 313c and 323c.

First through third hole-transporting layers 333a through 333c may be formed on the pair of the first organic semiconductor patterns 313a and 323a, the pair of the second organic semiconductor patterns 313b and 323b, and the pair of the third organic semiconductor patterns 313c and 323c, respectively.

The first through third hole-transporting layers 333a through 333c may be made of phthalocyanine, naphthalocyanine, porphyrin, oxadiazol, triphenylamine, triazole, imidazol, imidazolone, pyrazoline, tetrahydroimidazole, hydrazone, stillbene, pentacene, polythiophene, butadiene, or derivatives thereof.

An electron-transporting layer (not shown) and an emitting material layer (not shown) may be formed on each of the first through third hole-transporting layers 333a through 333c. As the electron-transporting layer, anthraquinodimethane, fluorenylidene methane, tetracyanoethylene, fluorenone, diphenoquinone oxadiazole, anthrone, thiopyran dioxide, diphenoquinone, benzoquinone, malononitrile, dinitrobenzene, nitroanthraquinone, maleic anhydride, perylenetetracarboxylic acid, and derivatives thereof may be used.

The first drain electrode 513a and second and third drain electrodes 513b and 513c may be formed on the first through third hole-transporting layers 333a through 333c or the electron-transporting layers, respectively.

A first fluorescent pattern 603a that is operable to cause light of the second color to be emitted, which is different from the first color, may be formed in the first subpixel region I, and a second fluorescent pattern 603b that is operable to cause light of a third color to be emitted, which is different from the first and second colors, may be formed in the second subpixel region II. No fluorescent pattern may be formed in the third subpixel region III, and light of the first color may be emitted from the third subpixel region III.

An encapsulation substrate 700 is adhered to the substrate 10 by a sealant 800.

The encapsulation substrate 700 may be separated from the first through third organic light-emitting transistors 1003a through 1003c by a space 750, and a dehumidifying agent may be disposed in the space 750.

Hereinafter, a method of fabricating the display device according to the fourth embodiment of the present disclosure will be described in detail with reference to FIGS. 20 through 25. FIGS. 21 through 25 are cross-sectional views sequentially showing processes included in the method of fabricating the display device according to the fourth embodiment of the present disclosure.

Figure 21:
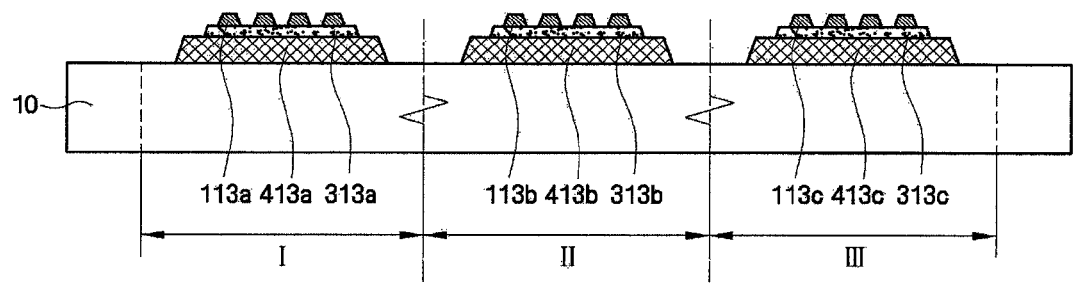
FIGS. 21 through 25 are cross-sectional views sequentially showing processes included in a method of fabricating the display device according to the fourth embodiment of the present disclosure.

Referring to FIG. 21, the first through third source electrodes 413a through 413c are formed on the first through third subpixel regions I through III of the substrate 10, respectively. Then, the first through third lower organic semiconductor patterns 313a through 313c are formed on the first through third source electrodes 413a through 413c. Next, the first through third gate electrodes 113a through 113c are formed in a grid pattern on the first through third lower organic semiconductor patterns 313a through 313c, respectively.

Figure 22:
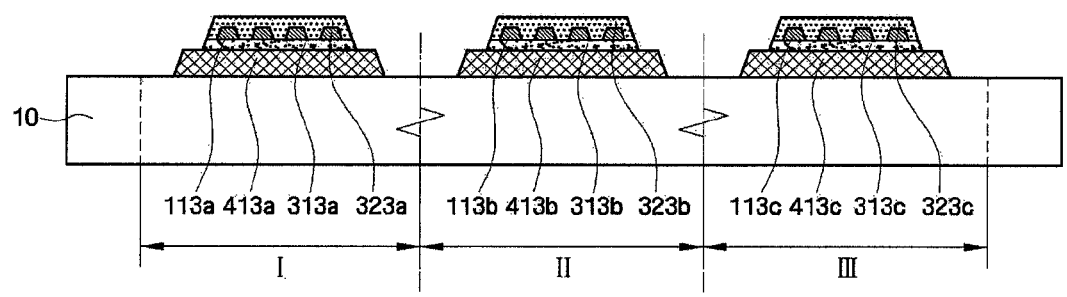

Referring to FIG. 22, the first through third upper organic semiconductor patterns 323a through 323c are formed to cover the first through third gate electrodes 113a through 113c, respectively. Accordingly, the first through third gate electrodes 113a through 113c are buried in the pair of the first organic semiconductor patterns 313a and 323a, the pair of the second organic semiconductor patterns 313b and 323b, and the pair of the third organic semiconductor patterns 313c and 323c, respectively.

Figure 23:
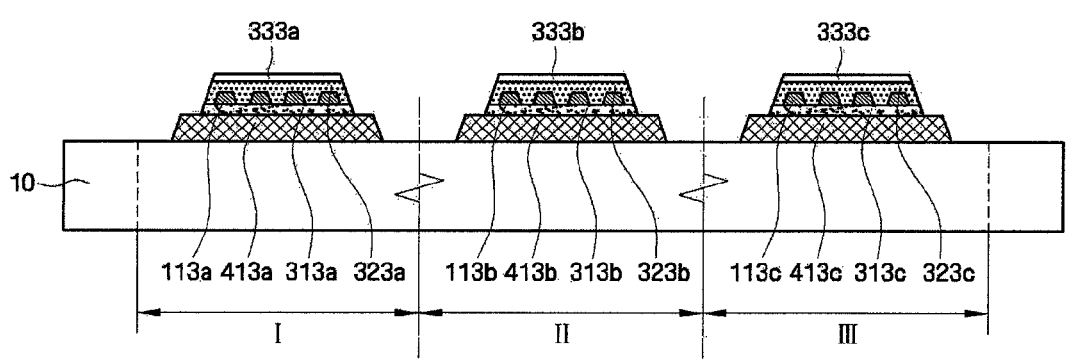

Referring to FIG. 23, the first through third hole-transporting layers 333a through 333c are formed on the first through third upper organic semiconductor patterns 323a through 323c, respectively.

Figure 24:
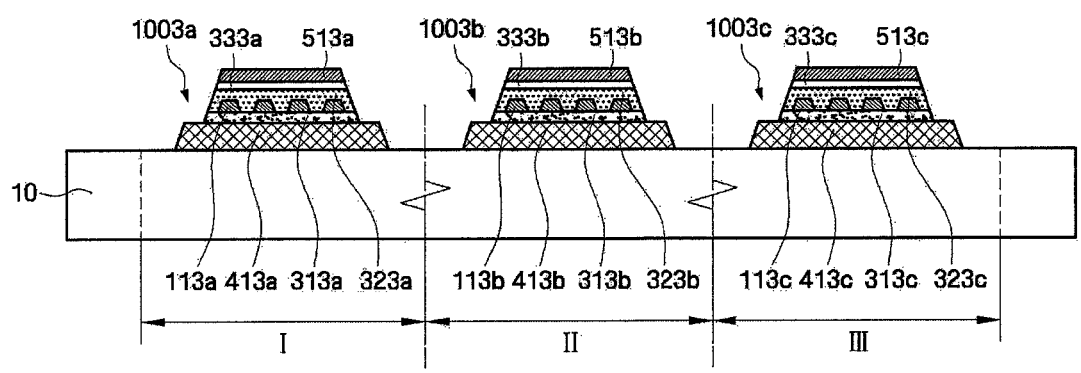

Next, referring to FIG. 24, the first through third drain electrodes 513a through 513c are formed on the first through third hole-transporting layers 333a through 333c, respectively.

Figure 25:
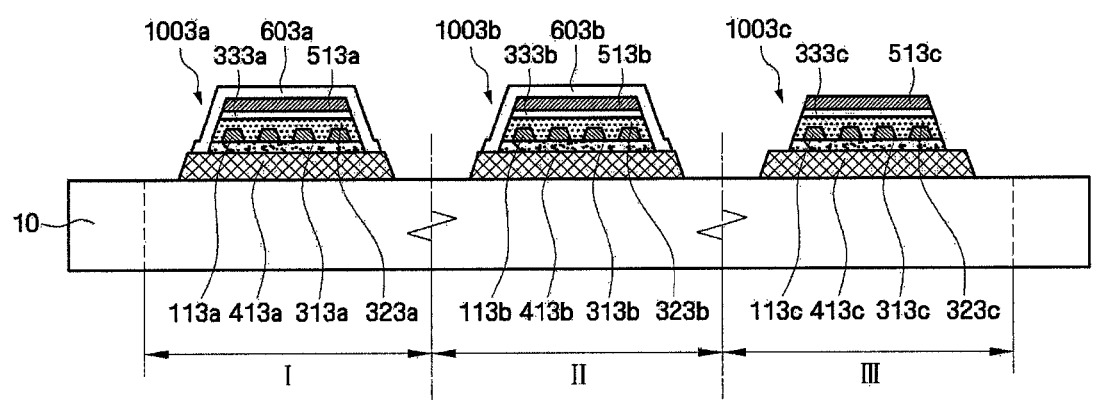

Referring to FIGS. 24 and 25, the first and second fluorescent patterns 603a and 603b are formed on the first and second organic light-emitting transistors 1003a and 1003b, respectively. The first fluorescent pattern 603a may be operable to cause light of the second color to be emitted which is different from the first color, and the second fluorescent pattern 603b may be operable to cause light of the third color to be emitted which is different from the first and second colors.

Referring to FIG. 21, the encapsulation substrate 700 is adhered to the substrate 10.

While the present disclosure has been particularly shown and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense only and not for purposes of limitation.

What is claimed is:

1. A display device comprising:
   a substrate that comprises first, second, and third subpixel regions;
   first, second, and third organic light-emitting transistors disposed in the first, second, and third subpixel regions, respectively, and operable to emit light of a first color, at least one of the first, second, and third organic light-emitting transistors including a bulk heterojunction structure, the bulk heterojunction structure comprising an n-type organic semiconductor that is configured to emit a blue light; and
   a first fluorescent pattern formed on the first organic light-emitting transistor and operable to cause light of a second color to be emitted, the first fluorescent pattern at least partially covering the first organic light-emitting transistor in a layout view of the display device and exposing a portion of the first organic light-emitting transistor in the layout view of the display device.

2. The display device of claim 1, further comprising a second fluorescent pattern that is formed on the second organic light-emitting transistor and is operable to cause light of a third color to be emitted, wherein the third organic light-emitting transistor is not covered by any color-adjusting pattern.

3. The display device of claim 1, wherein the first through third organic light-emitting transistors comprise first through third organic semiconductor patterns, respectively, the first fluorescent pattern partially covering the first organic semiconductor pattern in the layout view of the display device and exposing a portion of the first organic semiconductor pattern in the layout view of the display device, the first fluorescent pattern partially covering a gate electrode of the first organic light-emitting transistor in a layout view of the display device and exposing a portion of the gate electrode of the first organic light-emitting transistor in the layout view of the display device.

4. The display device of claim 1, wherein the first through third organic light-emitting transistors comprise first through third organic semiconductor patterns, respectively, wherein each of the first through third organic semiconductor patterns is made of one or more of a unipolar material, an ambipolar material, an acene-based material, a thiophene-based material, a fluorine-based material, a polyphenylenevinylene (PPV)-based material, and a perylene-based material.

5. The display device of claim 1, wherein the bulk heterojunction structure comprises one or more of P13, pentacene, α−75, DH4T, and O-octyl-OPV5.

6. The display device of claim 2, further comprising an encapsulation substrate which covers the first through third organic light-emitting transistors and the first and second fluorescent patterns.

7. The display device of claim 6, wherein the encapsulation substrate is made of at least one of a silicon-based material, an acryl-based material, a melamine-based material, an epoxy-based material, an imide-based material, an ester-based material, a nitride, and an oxide.

8. A method of fabricating a display device, the method comprising:
   providing a substrate which comprises first, second, and third subpixel regions;
   forming first, second, and third organic light-emitting transistors, which are operable to emit light of a first color, in the first, second, and third subpixel regions, respectively, at least one of the first, second, and third organic light-emitting transistors including a bulk heterojunction structure, the bulk heterojunction structure comprising an n-type organic semiconductor that is configured to emit a blue light; and
   forming a first fluorescent pattern, which is operable to cause light of a second color to be emitted, on the first organic light-emitting transistor, the first fluorescent pattern at least partially covering the first organic light-emitting transistor in a layout view of the display device and exposing a portion of the first organic light-emitting transistor in the layout view of the display device.

9. The method of claim 8, further comprising: forming a second fluorescent pattern, which is operable to cause light of a third color to be emitted, on the second organic light-emitting transistor; and avoiding forming any color-adjusting pattern on the third organic light-emitting transistor.

10. The method of claim 8, wherein the forming of the first through third organic light-emitting transistors comprises forming first through third organic semiconductor patterns by using an inkjet method, wherein each of the first through third organic semiconductor patterns is made of an organic semiconductor material which emits light of a first color.

11. The method of claim 8, wherein the forming of the first through third organic light-emitting transistors comprises:
    forming an organic semiconductor layer, which is operable to emit light of the first color, on the substrate; and
    forming the first through third organic semiconductor patterns simultaneously by patterning the organic semiconductor layer.

12. The method of claim 8, wherein the forming of the first through third organic light-emitting transistors comprises forming the first through third organic semiconductor patterns, each of which is operable to emit light of the first color and is made of an organic semiconductor material, forming source and drain electrodes, which are separated from each other, on each of the first through third organic semiconductor patterns, and forming a gate electrode between the source and drain electrodes.

13. The method of claim 12, wherein the forming of the first through third organic light-emitting transistors further comprises forming a gate insulating film, the gate electrode is formed on the substrate, and the gate insulating film is formed on the gate electrode.

14. The method of claim 13, wherein the first through third organic semiconductor patterns are formed on the gate insulating film, and the source and drain electrodes are formed on each of the first through third organic semiconductor patterns to lie in the same plane after the first through third organic semiconductor patterns are formed.

15. The method of claim 13, wherein each of the first through third organic semiconductor patterns comprises a first-type organic semiconductor pattern and a second-type organic semiconductor pattern which are stacked on the gate insulating film, and
    the forming of the first through third organic semiconductor patterns, the source electrodes, and the drain electrodes comprises:
        forming the source electrodes and the first-type organic semiconductor pattern, which contacts the source electrodes, on the gate insulating film; and
        forming the second-type organic semiconductor pattern on the first-type organic semiconductor pattern and forming the drain electrodes on the second-type organic semiconductor pattern.

16. The method of claim 13, wherein each of the first through third organic semiconductor patterns comprises a first-type organic semiconductor pattern and a second-type organic semiconductor pattern which are stacked on the gate insulating film, the source and drain electrodes are formed on the gate insulating film to be in the same plane, and the forming of each of the first through third organic semiconductor patterns comprises:
    forming the first-type organic semiconductor pattern which is disposed in the same plane as the source electrodes and has a side contacting the source electrodes; and
    forming the second-type organic semiconductor pattern which is disposed in the same plane as the drain electrodes, has a side contacting the drain electrodes, and has the other side overlapping part of the first-type organic semiconductor pattern.

17. The method of claim 12, wherein the forming of the first through third organic light-emitting transistors comprises:
    forming the source electrodes on the substrate;
    forming the first through third organic semiconductor patterns on the source electrodes, respectively, and forming gate electrodes that are inserted into each of the first through third organic semiconductor patterns; and
    forming the drain electrodes on the first through third organic semiconductor patterns, respectively.

18. The display device of claim 1, wherein the first fluorescent pattern includes a sulfide-based material.

19. The display device of claim 1, further comprising a mask layer disposed between the first fluorescent pattern and a source electrode of the first organic light-emitting transistor.

* * * * *